United States Patent
Gupta et al.

[11] Patent Number: 6,166,959
[45] Date of Patent: Dec. 26, 2000

[54] FLASH MEMORY ARRAY WITH INTERNAL REFRESH

[75] Inventors: Anil Gupta, San Jose; Steve Schumann, Sunnyvale, both of Calif.

[73] Assignee: Atmel Corporation, San Jose, Calif.

[21] Appl. No.: 09/548,504

[22] Filed: Apr. 13, 2000

Related U.S. Application Data

[63] Continuation of application No. 09/156,213, Sep. 17, 1998, Pat. No. 6,088,268.
[51] Int. Cl.$^7$ .................................................... G11C 16/06
[52] U.S. Cl. ............... 365/185.25; 365/222; 365/185.33; 365/185.29
[58] Field of Search ............... 365/189.01, 185.01, 365/185.25, 185.33, 185.29, 222

[56] References Cited

U.S. PATENT DOCUMENTS

| | | | |
|---|---|---|---|
| 5,365,486 | 11/1994 | Schreck | 365/222 |
| 5,469,444 | 11/1995 | Endoh et al. | 371/215 |
| 5,511,020 | 4/1996 | Hu et al. | 365/185.28 |
| 5,699,297 | 12/1997 | Yamazaki et al. | 365/185.25 |
| 5,764,568 | 6/1998 | Chevallier | 365/185.03 |
| 5,768,193 | 6/1998 | Lee et al. | 365/185.25 |
| 5,822,245 | 10/1998 | Gupta et al. | 365/185.12 |
| 5,950,224 | 9/1999 | Devin | 711/106 |
| 6,088,268 | 7/2000 | Gupta et al. | 365/185.25 |

*Primary Examiner*—Viet Q. Nguyen
*Attorney, Agent, or Firm*—Sierra Patent Group, Ltd.

[57] ABSTRACT

In a flash memory array, an internal refresh periodically rewrites the information stored in each of the rows of memory cells in a flash memory. The flash memory array includes a refresh pointer bitline that indicates the row to be refreshed. In a first embodiment of the present invention, the internal refresh is performed automatically after every user erase/program cycle. In second and third embodiments, the user of the of the flash memory array selects when the internal refresh is performed, but the address of the row to be refreshed is supplied internally. In each of the three the embodiments, the internal refresh includes the four operations of SCAN, REFRESH ERASE, REFRESH PROGRAM, and INCREMENT.

4 Claims, 7 Drawing Sheets

| MODE | YA | YB | YASCAN | YBSCAN | VMY |
|---|---|---|---|---|---|
| 120- SCAN | 0 | X | 1 | 1 | Vcc |
| 122- USER ERASE | 1 | 1 | 1 | 1 | 10V |
| 124- USER PROGRAM | ✓ | ✓ | 0 | 0 | 10V |
| 126- REFRESH ERASE | 1 | 1 | 1 | 1 | 10V |
| 128- REFRESH PROGRAM | ✓ | ✓ | 0 | 0 | 10V |
| 130- INCREMENT | 0 | X | 1 | 1 | 10V |

TABLE I

| MODE | YA | YB | YASCAN | YBSCAN | VMY |
|---|---|---|---|---|---|
| 140- POINTER READ | 0 | X | 1 | 1 | Vcc |
| 141- USER ERASE | 1 | 1 | 1 | 1 | 10V |
| 144- USER PROGRAM | ✓ | ✓ | 0 | 0 | 10V |
| 146- POINTER PROGRAM | 0 | X | 1 | 1 | 10V |
| ⋮ | | | | | |
| 148- SCAN | 0 | X | 1 | 1 | Vcc |
| 150- REFRESH ERASE | 1 | 1 | 1 | 1 | 10V |
| 152- REFRESH PROGRAM | ✓ | ✓ | 0 | 0 | 10V |
| 154- NCREMENT | 0 | X | 1 | 1 | 10V |

TABLE II

| MODE | YA | YB | YASCAN | YBSCAN | VMY |
|---|---|---|---|---|---|
| 156- USER ERASE | 1 | 1 | 0 | 0 | 10V |
| 158- USER PROGRAM | ✓ | ✓ | 0 | 0 | 10V |
| ⋮ | | | | | |
| 160- SCAN | 0 | X | 1 | 1 | Vcc |
| 162- REFRESH ERASE | 1 | 1 | 1 | 1 | 10V |
| 164- REFRESH PROGRAM | ✓ | ✓ | 0 | 0 | 10V |
| 166- INCREMENT | 0 | X | 1 | 1 | 10V |

TABLE III

| MODE | PASSGATE | PULLDOWN |
|---|---|---|
| SCAN | -2V | VMP |
| READ | <1V | VMP |
| REFRESH ERASE | -10V | ~1.5V (VWG) |
| REFRESH PROGRAM | -2V | VMP |
| INCREMENT | -2V | VMP |
| USER ERASE | <1V | ~1.5V (VWG) |
| USER PROGRAM | VM | 0V |

TABLE IV

| MODE | VM | VMP | VMG | NVM |
|---|---|---|---|---|
| SCAN/READ | 5V | 5V | — | 0 |
| USER & REFRESH ERASE | 5V | 5V | 1.5V | -10V |
| USER & REFRESH PROGRAM | 10V | 10V | — | 0 |
| INCREMENT | 10V | 10V | — | 0 |

TABLE V

FLASH MEMORY ARRAY WITH INTERNAL REFRESH

This application is a continuation of application Ser. No. 09/156,213, filed Sep. 17, 1998, now U.S. Pat. No. 6,088,268.

BACKGROUND OF THE INVENTION

1. Field of the Invention

The present invention relates to flash memory arrays. More particularly, the present invention relates to an internal refresh mode in a flash memory array.

2. The Prior Art

Figure 1:
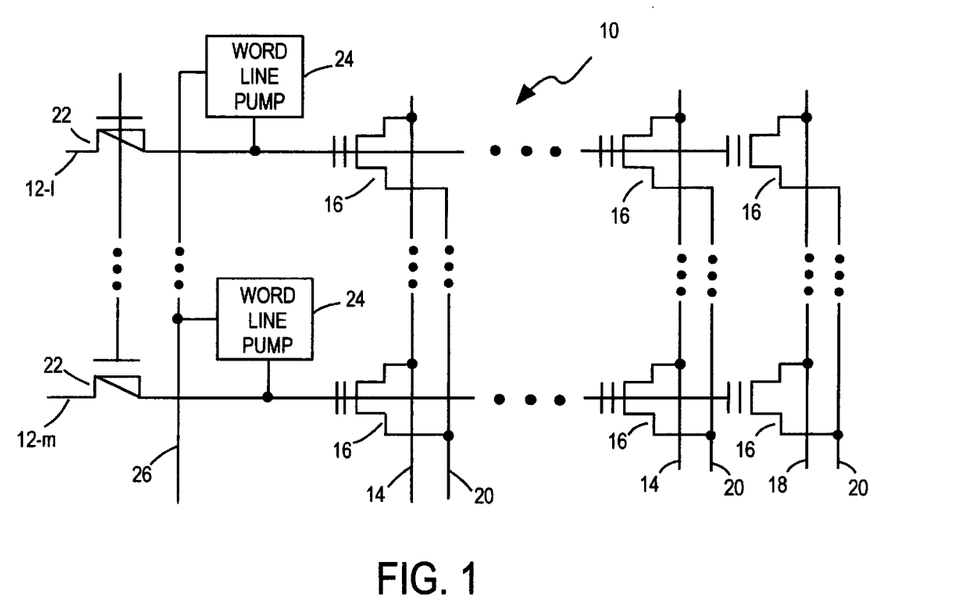
FIG. 1 is a portion of a known flash memory array suitable for use according to the present invention.

In a typical flash memory array, the memory cells are arranged in a rectangular array of rows and columns. Portions of a conventional flash memory array 10 are depicted in FIG. 1. In the flash memory array 10, wordlines 12 and bitlines 14 are arranged as a matrix to form intersections that have flash memory cells 16 disposed therein. A known flash memory cell suitable for use according to the present invention is described in U.S. Pat. No. 4,783,766, filed May 30, 1986, assigned to the same assignee as the present invention, and incorporated herein by reference.

Each wordline 12 in the flash memory array 10 represents one of M rows, wherein each of the M rows has N words. Each of the M rows in the flash memory array 10 is typically referred to as a page of memory. The number of bitlines 14 in the flash memory array 10 is approximately the same as the number of N words in a row multiplied by the number of bits in each word. For example, in the 4-Megabit Serial DataFlash™, part number AT45DB041, by Atmel Corporation, San Jose, Calif., each row of a known 4M flash memory array 10, there are 264 words each having 8 bits.

For each of the flash memory elements disposed at the intersection of a wordline 12 and a bit line 14, the drain of the flash memory element 16 is connected to the bit line 14, the source of the flash memory element 16 is connected to an array source voltage by an array source line 20, and the gate of the flash memory element 16 is connected to the word line 12. For each of the word lines 12, a P-channel MOS isolation pass transistor 22 is connected in series between wordline access circuitry (not shown) and the first flash memory element 16 disposed at the intersection of the wordline 12 and a bit line 14. Connected to the portion of each word line 12 disposed between P-channel MOS isolation pass transistor 22 and the gate of the first flash memory element 16 in each row is a word line pump 24 connected to a source of negative voltage during erase of about –15 volts to about –4 volts, and preferably –10 volts, by word line negative pump line 26.

The operations that may be performed on the memory cells in the flash memory array are PROGRAM, ERASE and READ. The PROGRAM operation is often performed by driving selected bitlines 14 connected to the drain region in the flash memory cells 16 to a first voltage and driving the gates of the flash memory cells 16 connected to selected wordlines 12 to a second higher voltage to perform hot electron injection in a manner well known to those of ordinary skill in the art.

The ERASE operation is performed by driving the gate of the flash memory cell 16 to a voltage that is substantially less than a voltage placed on the bitline 14. In doing so, electrons are tunneled off of the floating gate of the flash memory cell 16 in a manner well known to those of ordinary skill in the art. For a conventional flash memory array 10, it is known that ERASE operation may be a BULK ERASE wherein the entire flash memory array 10 is erased, a SECTOR ERASE wherein a sector in the flash memory array 10 is erased, or a PAGE ERASE wherein an erase may be performed on a single row in a sector. By constraining the ERASE operation to either a SECTOR or BULK ERASE, the disturb phenomenon associated with the occurrence of unintended tunneling in unselected rows is reduced.

Although the erase disturb phenomenon can be reduced by the manner in which the ERASE operation is performed, an external refresh of the memory cells may be performed as described in the data sheet for the Atmel 4-Megabit Serial Dataflash™ part no. AT45DB041 for disturbs cause by both erase and program operations. In the external refresh an Auto Page Rewrite command may be employed by the data flash user to refresh a row in the flash memory array by reading the data stored in the row into a buffer, and then writing the data stored in the buffer back into the same row. The Auto Page Rewrite command describing the buffer write operation is further disclosed in U.S. patent application Ser. No. 08/824,175 to Gupta et al., filed Mar. 26, 1997, entitled "Dual Buffer Flash Memory Architecture With Multiple Operating Modes", assigned to the same assignee as the present application, and expressly incorporated herein by reference. Performing the external refresh with the Auto Page Rewrite command requires the user of the flash memory array to provide the instructions for performing the Auto Page Rewrite and also to provide a sequentially incremented page address for row to be refreshed. Requiring the user to provide these instructions may at times prove to be cumbersome to the user of the flash memory array.

It is therefore an object of the present invention to provide an internal row refresh for a flash memory array that automatically scrolls through the rows in a flash memory array to refresh the memory cells of the flash memory array.

It is a further object of the present invention to provide an internal row refresh for a flash memory array that is programmable by the user to automatically scroll through the rows in a flash memory array to refresh one row of the memory cells after every Nth erase and program operation of the flash memory array.

BRIEF DESCRIPTION OF THE INVENTION

According to the present invention, an internal refresh periodically rewrites the information stored in each of the rows of memory cells in a flash memory. The flash memory array includes a refresh pointer bitline that indicates the row to be refreshed. In a first embodiment of the present invention, the internal refresh is performed automatically after every user erase/program cycle. In second and third embodiments, the user of the flash memory array selects when the internal refresh is performed, but the address of the row to be refreshed is supplied internally. In each of the three embodiments, the internal refresh includes the four operations of SCAN, REFRESH ERASE, REFRESH PROGRAM, and INCREMENT.

In the first embodiment of the present invention, the SCAN operation of the internal refresh is followed by user erase/program cycle, the internal refresh operation is then resumed by performing the REFRESH ERASE, REFRESH PROGRAM, and INCREMENT OPERATIONS.

In the second embodiment of the present invention, the user erase/program cycle includes the operation of POINTER READ and POINTER PROGRAM. These operations check to see whether the row to be accessed in the user erase/program cycle is also the next row to be internally refreshed, and if so maintain the state of memory cell on the refresh pointer bitline after the user erase/program cycle. After a user erase/program cycle selected by the user of the flash memory array, the internal refresh is performed with the SCAN, REFRESH ERASE, REFRESH PROGRAM, and INCREMENT operations.

In the third embodiment of the present invention, a refresh select circuit is included in the flash memory array. With inclusion of the refresh select circuit, the POINTER READ and POINTER PROGRAM are not performed during each user erase/program cycle. After a user erase/program cycle selected by the user of the flash memory array, the internal refresh is performed with the SCAN, REFRESH ERASE, REFRESH PROGRAM, and INCREMENT operations.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to the present invention, an internal refresh periodically rewrites the information stored in each of the rows of memory cells in a flash memory. The refresh of the present invention is referred to as "internal", because unlike the prior art, the page address of the page to be rewritten is not applied "externally" by the user of flash memory array. Accordingly, in the present invention, in the memory array 10 of FIG. 1, there is a bitline that is a dedicated address or refresh pointer. The use of the refresh pointer bitline will be described in detail below. In the portion of the flash memory array 10 depicted in FIG. 1, the refresh pointer bitline is indicated by reference numeral 18. It should be appreciated that the flash memory array 10 depicted in FIG. 1 may represent an entire flash memory array or simply a sector in a flash memory array as is well understood by those of ordinary skill in the art.

In a first embodiment of the present invention, the periodicity of the internal refresh is such that an internal refresh is performed after every user erase/program cycle. In alternative second and third embodiments of the present invention, the periodicity of the internal refresh is set by the user of the flash memory array such that an internal refresh is performed in response to a command by the user after a user erase/program cycle selected by the user. For each of the embodiments, internal refresh includes the four operations of SCAN, REFRESH ERASE, REFRESH PROGRAM, and INCREMENT.

In the SCAN operation, the memory cell 16 on the refresh pointer bitline 18 for each row is read until a value of '0' is found. The row in the flash memory array 10 that has the '0' value in the memory cell 16 on the refresh pointer bitline 18 will have the data stored therein refreshed by being rewritten. Also as part of the SCAN operation, the address of the row to be refreshed is stored in a scan latch. Before the REFRESH ERASE and REFRESH PROGRAM operations, the data in the row being refreshed is written to a buffer (not shown). The row is then erased by the REFRESH ERASE operation, and the data stored in the buffer is written back into the row by a REFRESH PROGRAM operation. In the INCREMENT operation, the row address in the scan latch is incremented to reflect the address of the next row to be refreshed, and the corresponding memory cell 16 on the refresh pointer bitline 18 for the next row to be refreshed is written to a '0' by a PROGRAM operation.

Figure 2:
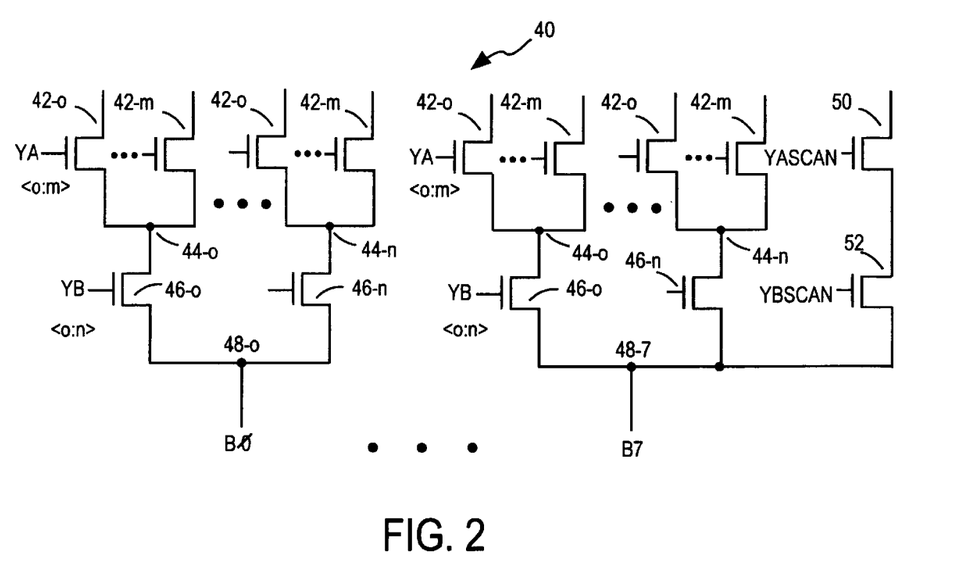
FIG. 2 is a bitline decoder circuit for a flash memory array suitable for use according to the present invention.

Turning now to FIG. 2, an exemplary bit line decoder 40 that decodes the bitlines of a flash memory array 10 such as is depicted in FIG. 1, and is suitable for use according to the present invention is illustrated. It will be appreciated by those of ordinary skill in the art that other implementations of the bitline decoder 40 may be employed without deviating from the present invention disclosed herein. The bitline decoder 40 selects a word from a selected row in the flash memory 10 upon which to perform a desired operation, such as for example, a READ or PROGRAM. For the example illustrated in FIG. 2, the word width of the selected word is eight bits (B0–B7).

In the bit line decoder 40, each of the bit lines 14 in FIG. 1 is connected to a first source/drain of a separate N-channel MOS pass gate 42. The N-channel MOS pass gates 42 are grouped together such that the second source/drain of each of the N-channel MOS pass gates 42 in the same group are connected together to form a common node 44. The gates of N-channel MOS pass transistors 42 are coupled to the decode signals YA<0:m>.

Each common node 44 is connected to a first source/drain of an N-channel MOS pass transistor 46. The N-channel MOS pass transistors 46 are grouped such that the second source/drain of each of the N-channel MOS pass gates 46 in the same group are connected together to form a common node 48. The N-channel MOS pass transistors 46 are connected by the signals YB<0:n>. The common nodes 48-0 through 48-7 provide the I/O for the word that is being operated on in the flash memory array.

In the regular operation of the flash memory array 10, the YA<0:m> and YB<0:n> select a word in the selected row when a desired operation is to be performed. In the selection process, one of the signals YA<0:m> will have a HIGH logic level to turn on one of the N-channel MOS transistors 42-0 through 42-$m$ in each of the N groups. It should be appreciated from the bitline decoder that there will be eight sets (one group for each bit in the eight bit wide word being decoded) of N groups. A HIGH logic level from one of the YB<0:n> signals will simultaneously turn on one of the N-channel MOS transistors 46-0 through 46-$n$ to provide a path through one of the N-channel MOS transistors 42-0 through 42-m that was selected by the YA<0:m> signals.

The refresh pointer bit line 18 of FIG. 1 is connected to first source/drain of N-channel MOS pass transistor 50 having a second source/drain connected to a first source/drain of N-channel MOS pass transistor 52. A second source/drain of N-channel MOS pass transistor 52 is connected to common node 48-7. The gates of N-channel MOS pass transistors 50 and 52 are connected to the signals YASCAN and YBSCAN, respectively, that are generated in response to control signals to be described below. When an operation is to be performed on the memory cell 16 on the bitline 18 of a selected row, the YASCAN and YBSCAN signals provide a HIGH logic level to the gates of N-channel MOS pass transistors 50 and 52 to turn them on.

Figure 3A:
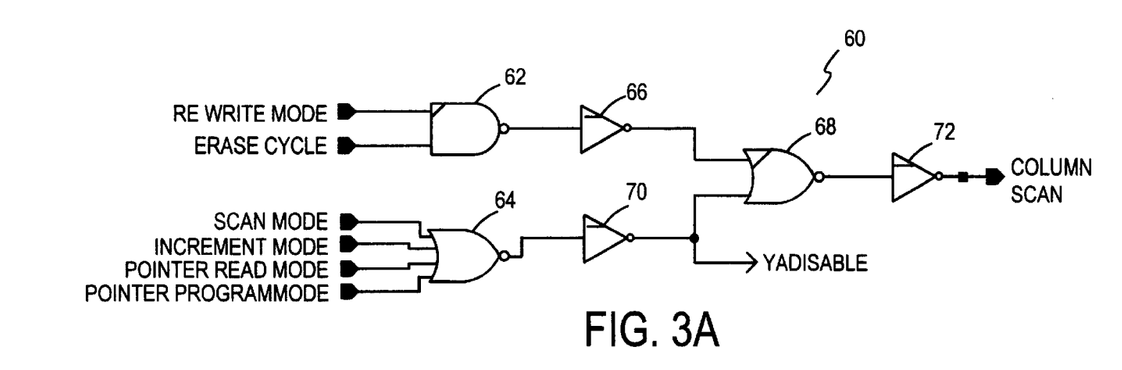
FIGS. 3A–3C are schematic diagrams of circuits for generating the YASCAN and YBSCAN signals employed by the bitline decoder circuit of FIG. 2 according to the present invention.
Figure 3B:
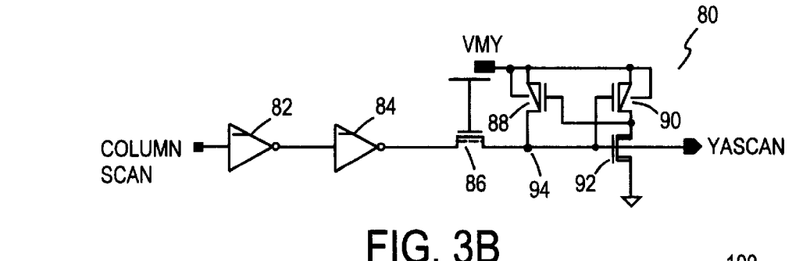
Figure 3C:
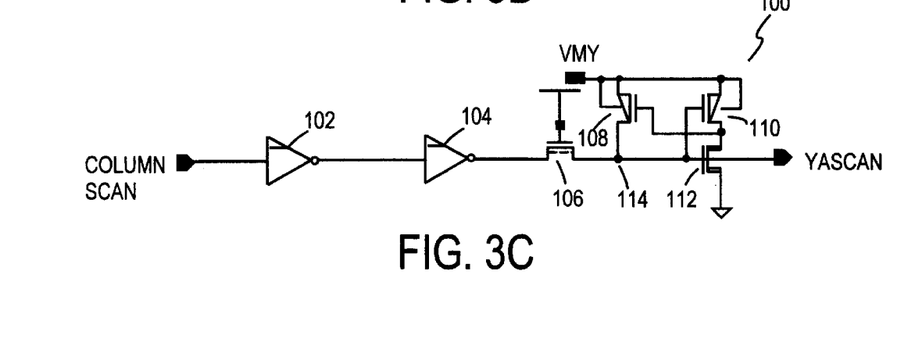

FIGS. 3A, 3B and 3C schematically depict a COLUMN scan circuit 60, a YA scan circuit 80 and a YB scan circuit 100, respectively, for generating the COLUMNSCAN, YASCAN, and YBSCAN signals in response to the control signals REWRITE MODE, ERASE CYCLE, SCAN MODE, INCREMENT MODE, POINTER READ MODE, and POINTER PROGRAM MODE. In the COLUMN scan circuit 60, a NAND gate 62 has a first input connected to the REWRITE MODE control signal and a second input connected to the ERASE CYCLE control signal, and a NOR gate 64 has a first input connected to a SCAN MODE control signal, a second input connected to an INCREMENT MODE control signal, a third input connected to an POINTER READ MODE control signal, and a fourth input connected to an POINTER PROGRAM MODE control signal.

The output of NAND gate 62 is connected through an inverter 66 to a first input of NOR gate 68, and the output of NOR gate 64 is connected through an inverter 70 to a second input of NOR gate 68. The output from inverter 70 also forms the signal YADISABLE. The output of NOR gate 68 is fed through an inverter 72 to form the signal COLUMNSCAN. The COLUMNSCAN signal is coupled to both the YA and YB scan circuits 80 and 100, respectively.

In the YA scan circuit 80 of FIG. 3B, the COLUMNSCAN signal is fed through first and second inverters 82 and 84 to the drain of N-channel MOS transistor 86. The source of N-channel MOS transistor 86 is connected to the source of P-channel MOS transistor 88, the gate of P-channel MOS transistor 90, and the gate of N-channel MOS transistor 92 to form a common node 94. The gate of N-channel MOS transistor 86 is coupled to voltage source Vdd. A variable voltage source, VMY, is coupled to the drain and bulk (backgate) of P-channel MOS transistors 88 and 90. The gate of P-channel MOS transistor 88 is connected to a common connection between the source of P-channel MOS transistor 90 and the drain of N-channel MOS transistor 92. The source of N-channel MOS transistor 92 is connected to ground. The signal YASCAN, coupled to the gate of N-channel MOS transistor 50 of FIG. 2, is formed on common node 94.

The YB scan circuit 100 of FIG. 3C is identical to the YA scan circuit 80 of FIG. 3B. Accordingly, in the YB scan circuit 100, the COLUMNSCAN signal is fed through first and second inverters 102 and 104 to the drain of N-channel MOS transistor 106. The source of N-channel MOS transistor 106 is connected to the source of P-channel MOS transistor 108, the gate of P-channel MOS transistor 110, and the gate of N-channel MOS transistor 112 to form a common node 114. The gate of N-channel MOS transistor 106 is coupled to voltage source Vdd. A variable voltage source, VMY, is coupled to the drain and bulk (backgate) of P-channel MOS transistors 108 and 110. The gate of P-channel MOS transistor 108 is connected to a common connection between the source of P-channel MOS transistor 110 and the drain of N-channel MOS transistor 112. The source of N-channel MOS transistor 112 is connected to ground. The signal YBSCAN, coupled to the gate of N-channel MOS transistor 52 of FIG. 2, is formed on common node 114.

Referring now to Table I in FIG. 4, the operation of the COLUMN scan circuit 60, YA scan circuit 80, and YB scan circuit 100 according to a first embodiment of the present will be described. The signals YASCAN, and YBSCAN illustrated in Table I are generated in response to the control signals ERASE CYCLE, SCAN MODE, and INCREMENT MODE and the variable voltage level VMY. The control signals REWRITE MODE, POINTER READ MODE, and POINTER PROGRAM MODE are not employed in the first embodiment of the present invention, and as such may either be omitted, or in the case of the REWRITE MODE control signal be tied HIGH, and in the case of the POINTER READ MODE and POINTER PROGRAM MODE control signals be tied LOW.

According to Table I, for the internal refresh operation performed according to the first embodiment of the present invention in conjunction with each user erase/program cycle, a SCAN operation is first performed at step 120 prior to performance of the USER ERASE and USER PROGRAM operations, illustrated in steps 122 and 124, in the user erase/program cycle. In the SCAN operation, a HIGH logic level SCAN MODE signal is applied to the first input of NOR gate 64. Accordingly, a HIGH logic level COLUMN SCAN signal is coupled from the COLUMN scan circuit 60 to both the YA scan circuit 80, and YB scan circuit 100.

In FIG. 3B, the HIGH logic level of the COLUMN SCAN signal is passed by N-channel MOS pass transistor 86 to turn on N-channel MOS transistor 92. As a result, the ground voltage is applied to the gate of P-channel MOS transistor 88 to turn it on and place the variable voltage VMY, which during the SCAN operation is Vcc, onto the common node 94 to provide the YASCAN signal to the gate of N-channel MOS transistor 50 and thereby turn it on. The operation of YB scan circuit 100, in FIG. 3C to provide the YBSCAN signal to the gate of N-channel MOS transistor 52 and thereby turn it on is the same as that of the YA scan circuit 80, just described.

During the SCAN operation, the HIGH logic level SCAN MODE signal also results in a HIGH YADISABLE signal. When the YADISABLE signal is HIGH a LOW logic level is applied to the gates of N-channel MOS transistors 42-0 through 42-m of FIG. 2 to prevent any of the other memory cells 16 in the flash memory array 10 from being read. The signal applied to the gates of the N-channel MOS pass transistors 46 is a don't care. Once a '0' value has been read from a memory cell 16 in the refresh pointer column 18, the address of the row in which the memory cell 16 is disposed is stored in a scan latch. A scan latch suitable for storing the row address is within the level of skill of those of ordinary skill in the art and will not be described herein to avoid overcomplicating the disclosure and thereby obscuring the present invention.

At steps 122 and 124 the operations of USER ERASE and USER PROGRAM, respectively, are performed on the row selected by the user. To do so, at step 122 the SCAN MODE signal is brought LOW, and the ERASE CYCLE signal is brought HIGH. As mentioned above, in the first embodiment of the present invention described herein, the REWRITE MODE signal is not required. As a consequence, the COLUMN SCAN signal is HIGH, and as in step 120, the variable voltage level VMY appears on common nodes 94 and 114 of the YA scan circuit 80, and YB scan circuit 100, respectively. However, unlike step 120, the variable voltage level VMY is 10 volts rather than Vcc to properly turn on the N-channel MOS transistors 50 and 52 during the USER ERASE operation. Also during the USER ERASE operation, each of the N-channel MOS transistors 42 and 46 is turned on so that entire selected row is erased.

At step 124 the ERASE CYCLE signal makes a transition from HIGH to LOW, and the SCAN MODE and INCREMENT MODE signals are kept LOW. As mentioned above, in the first embodiment of the present invention described herein, the POINTER READ MODE and POINTER PROGRAM MODE control signals are not required. As a result, the outputs of both the NAND gate 62 and the NOR gate 64 are both HIGH. These HIGH signals are fed through inverter 66 and 70 to the first and second inputs of NOR gate 68. The HIGH output of NOR gate 68 is fed through inverter 72 so that the COLUMNSCAN signal is LOW.

In YA scan circuit 80, the LOW COLUMN SCAN signal is fed through inverters 82 and 84 and passed by N-channel MOS transistor 86 to node 94 where it is latched by P-channel MOS transistors 88 and 90, and N-channel MOS transistor 92. The operation of the YBSCAN circuit 100 is the same as the operation of the YASCAN circuit just described. With the YASCAN and YBSCAN signals both LOW, the N-channel MOS transistors 50 and 52 are both turned off. As a result, the memory cell 16 on the refresh pointer bit line 18 which was erased at step 122 cannot now be programmed. The YA and YB signals which properly decode the portions of the row that the user wishes to program into the flash memory array 10 are also provided at step 124.

At steps 126 and 128, the internal refresh operation that began with the SCAN operation at step 120 is continued. The REFRESH ERASE and REFRESH PROGRAM operations at steps 126 and 128 are similar to the USER ERASE and USER PROGRAM operations steps 122 and 124, with the exception that the row upon which the operations are being performed corresponds to the row address latched in the scan latch during the SCAN operation of step 120. Prior to REFRESH ERASE at step 126, the row to be refreshed is first written into a buffer. At step 126, the ERASE CYCLE signal is brought HIGH. As previously described, the COLUMNSCAN signal will go HIGH as a result.

With the COLUMNSCAN signal HIGH and the variable voltage VMY at 10 volts, the voltage at nodes 94 and 114 of YA scan and YB scan circuits 80 and 100, respectively, that form the YASCAN and YBSCAN signals are also at 10 volts. Further, the YA and YB decode signals turn on all of the N-channel MOS transistors 42 and 46. Since all of the transistors in the decoder 40 illustrated in FIG. 2 are turned on, the row at the selected address is completely erased. At step 128, the ERASE CYCLE signal is brought LOW. As a result, the data stored in the buffer is rewritten to the selected row in the same manner as the USER PROGRAM operation that occurred at step 124.

At step 130, the internal refresh cycle is completed with the INCREMENT operation. In the INCREMENT operation, the row address latched in the scan latch is incremented and the memory cell 16 on the refresh pointer bit line 18 corresponding to the incremented row address is programmed to a value of '0'. At step 130, the INCREMENT MODE signal is brought HIGH, and as a result, the COLUMNSCAN signal is also HIGH. With the COLUMN SCAN signal HIGH, and the variable voltage VMY at 10 volts, the common nodes 94 and 114 in YA scan and YB scan circuits 80 and 100, respectively, forming the YASCAN and YBSCAN signals, and coupled to N-channel MOS transistors 50 and 52, are set at 10 volts for the program operation. The YA signals provided to the bit line decode circuit 40 in FIG. 2 are all set to a LOW voltage level so that none of the other bits in the selected row are programmed.

According to the second and third embodiments of the present invention, the user of the flash memory array 10 may set the periodicity of the internal refresh so that the internal refresh is performed after a user erase/program cycle as desired by providing an "internal refresh command" to the flash memory array 10. Unlike the prior art, the address of the row to be refreshed is not provided by the user, but rather, is kept track of by the flash memory array 10 and provided internally by the flash memory array 10.

In the second embodiment of the present invention, the SCAN, REFRESH ERASE, REFRESH PROGRAM, and INCREMENT operations of the internal refresh are implemented with the COLUMN scan circuit 60, the YA scan circuit 80, and YB scan circuit 100 in response to the ERASE CYCLE, SCAN MODE, INCREMENT MODE, POINTER READ MODE and POINTER PROGRAM MODE control signals. The YA, YB, YASCAN, and YBSCAN signals, and variable voltage VMY associated with the second embodiment of the present invention are illustrated in Table II of FIG. 4.

In Table II, the user program/erase cycle including the POINTER READ, USER ERASE, USER PROGRAM, and POINTER PROGRAM operations is depicted at steps 140, 142, 144, and 146, and an internal refresh including the SCAN, REFRESH ERASE, REFRESH PROGRAM, and INCREMENT performed after a selected user program/erase cycle is depicted at steps 148, 150, 152 and 154.

In the second embodiment of the present invention, at step 140, during each user erase/program cycle, a POINTER READ of the memory cell 16 on the refresh pointer bitline 18 of the row to be erased and programmed is performed. In the POINTER READ operation, a HIGH logic level POINTER READ MODE signal is applied to the third input of NOR gate 64. Accordingly, a HIGH logic level COLUMN SCAN signal is coupled from the COLUMN scan circuit 60 to both the YA scan circuit 80, and YB scan circuit 100.

In FIG. 3B, the HIGH logic level of the COLUMN SCAN signal is passed by N-channel MOS pass transistor 86 to turn on N-channel MOS transistor 92. As a result, the ground voltage is applied to the gate of P-channel MOS transistor 88 to turn it on and place the variable voltage VMY, which during the POINTER READ operation is Vcc, onto the common node 94 to provide the YASCAN signal to the gate of N-channel MOS transistor 50 and thereby turn it on. The operation of YB scan circuit 100, in FIG. 3C to provide the YBSCAN signal to the gate of N-channel MOS transistor 52 and thereby turn it on is the same as that of the YA scan circuit 80, just described.

During the POINTER READ operation, the HIGH logic level POINTER READ MODE signal also results in a HIGH YADISABLE signal. When the YADISABLE signal is HIGH a LOW logic level is applied to the gates of N-channel MOS transistors 42-0 through **42-*m* of FIG. 2 to prevent any of the other memory cells 16 in the flash memory array 10 from being read. The signal applied to the gates of the N-channel MOS pass transistors 46** is a don't care. When the contents of the memory cell being read during the POINTER READ operation are in programmed state, conventionally '0', an internal POINTER READ FLAG in the flash memory is set. The setting of flags is well understood by those of ordinary skill in the art and will not be further described herein.

At steps 142 and 144, the controls signals for performing the USER ERASE and USER PROGRAM operations are asserted as described above in steps 122 and 124 in the first embodiment of the present invention so that desired row is erased and programmed. After the completion of steps 142 and 144, when the POINTER READ FLAG is in a set state, the POINTER PROGRAM operation at step 146 is performed. In the POINTER PROGRAM operation the memory cell 16 on the refresh pointer bit line 18 corresponding to either the row just read and programmed by the user or an incremented row selected as a matter of program design choice by the user is programmed to a value of '0'.

At step 146, in the POINTER PROGRAM operation, a HIGH logic level POINTER PROGRAM MODE signal is applied to the fourth input of NOR gate 64, and as a result, the COLUMNSCAN signal is also HIGH. With the COLUMN SCAN signal HIGH, and the variable voltage VMY at 10 volts, the common nodes 94 and 114 in YA scan and YB scan circuits 80 and 100, respectively, forming the YASCAN and YBSCAN signals, and coupled to N-channel MOS transistors 50 and 52, are set at 10 volts for the program operation. The YA signals provided to the bit line decode circuit 40 in FIG. 2 are all set to a LOW voltage level so that none of the other bits in the selected row are programmed.

The internal refresh steps 148, 150, 152, and 154, in the second embodiment of the present invention are performed in the same manner as the internal refresh steps 120, 126, 128, and 130 in the first embodiment of the present invention.

In the third embodiment of the present invention, the SCAN, REFRESH ERASE, REFRESH PROGRAM, and INCREMENT operations of the internal refresh are implemented with the COLUMN scan circuit 60, the YA scan circuit 80, and YB scan circuit 100 in response to the REWRITE MODE, ERASE CYCLE, SCAN MODE, and INCREMENT MODE control signals and the variable voltage VMY. The YA, YB, YASCAN, and YBSCAN signals, and variable voltage VMY associated with the third embodiment of the present invention are illustrated in Table III of FIG. 4.

In Table III, the user program/erase cycle including the USER ERASE and USER PROGRAM operations is depicted at steps 156 and 158, and an internal refresh including the SCAN, REFRESH ERASE, REFRESH PROGRAM, and INCREMENT performed after a selected user program/erase cycle is depicted at steps 160, 162, 164, and 166. It should be observed that the USER PROGRAM step 158 is the same as the USER PROGRAM step 144, but that USER ERASE step 156 is different from the USER ERASE step 142.

In the third embodiment of the present invention, the POINTER READ and POINTER PROGRAM operations in the user erase/program cycle of the second embodiment of the present invention are not employed, while the REWRITE MODE control signal is employed. In the USER ERASE operation at step 156 the REWRITE MODE control signal coupled to he first input of NAND gate 62 is kept LOW. With the SCAN MODE and INCREMENT MODE signals also LOW, the COLUMNSCAN signal is also LOW. As a result, the YASCAN and YBSCAN signals are also LOW.

The operation of the internal refresh steps 160, 162, 164, and 166 in the third embodiment of the present invention is similar to the operation of the internal refresh steps 120, 126, 128, and 130 in the first embodiment of the present invention, with the exception that the REWRITE MODE control signal is asserted during the REFRESH ERASE and REFRESH PROGRAM operations.

It should be appreciated that in each of the three embodiments, when a HIGH signal is applied the gates of N-channel MOS transistors 42 and 46 by the signals YA and YB, respectively, the voltage applied to the gates of N-channel MOS transistors 42 and 46 is the variable voltage VMY.

In the third embodiment of the present invention, the flash memory array 10 of FIG. 1 is modified to include a refresh select circuit. The refresh select circuit is included so that the internal refresh may be performed after a user erase/program cycle as desired without employing the POINTER READ and POINTER PROGRAM operations in the user erase/program cycle of the third embodiment of the present invention.

Figure 5:
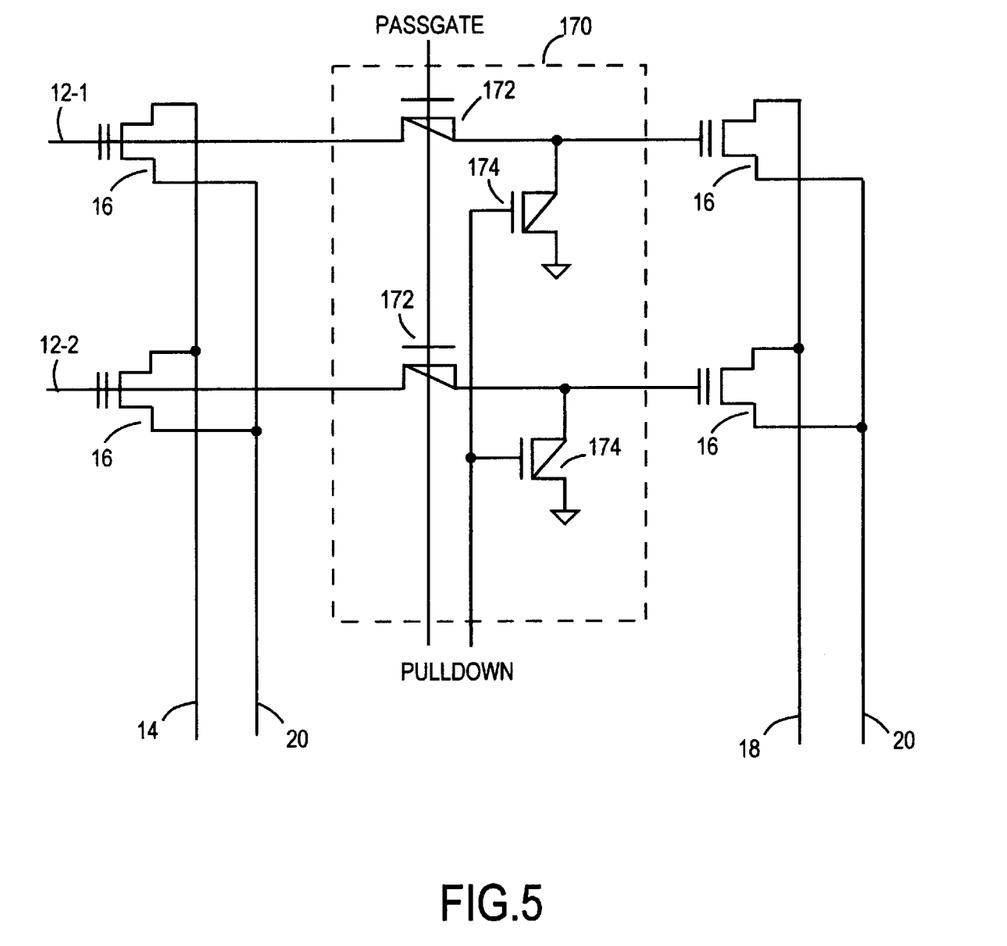
FIG. 5 is a schematic diagram of refresh select circuit suitable for use in a flash memory array according to a third embodiment of the present invention.

Turning now to FIG. 5 the refresh select circuit 170 employed in the third embodiment of the present invention is illustrated. In the refresh select circuit 170, there is disposed in each of the exemplary first and second wordlines 12-1 and 12-2, between the memory cells 16 on the last bitline 14 in the flash memory array 10 and the memory cells 16 on the refresh pointer bitline 18, a P-channel MOS pass transistor 172 and a P-channel MOS pull-down transistor 174. It should be appreciated that the P-channel MOS pass transistor 172 and a P-channel MOS pull-down transistor 174 are provided in each of the row of the flash memory array 10 in a similar manner.

In each row the drain of the P-channel MOS pass transistor 172 is coupled to the wordline 12, and the source of the P-channel MOS pass transistor 172 is coupled to the memory cell 16 on the refresh pointer bitline 18. A PASSGATE signal generated by a pass gate circuit to be described below is connected to the gate of each P-channel MOS pass transistor 172. The source of the P-channel MOS pass transistor 172 is also coupled to the drain of P-channel MOS pull-down transistor 174. The source of P-channel pull-down transistor 174 is coupled to ground, and the gate of each P-channel pull-down transistor 174 is couple to a PULLDOOWN signal generated by the pass gate circuit to be described below.

Figure 6:
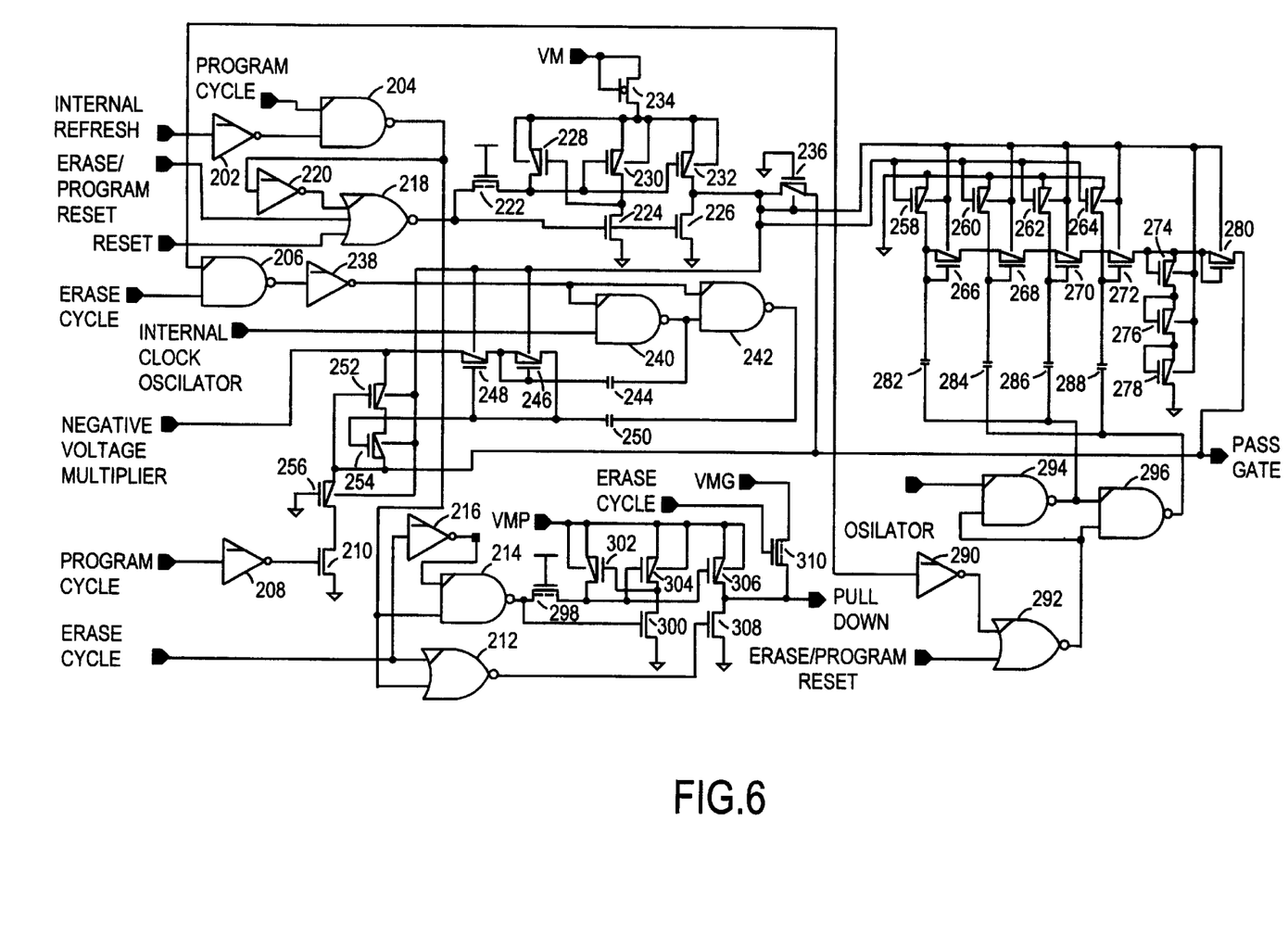
FIG. 6 is a schematic diagram of a pass gate circuit for generating the PASSGATE and PULLDOWN signals employed by the refresh select circuit of FIG. 5 according to the third embodiment of the present invention.

In FIG. 6, a pass gate circuit 200 that generates the PASSGATE and PULLDOWN signals in response to the control signals INTERNAL REFRESH, PROGRAM CYCLE, ERASE CYCLE, ERASE/PROGRAM RESET and RESET, and the bias voltages VM, VMP, NVM, and VWG is illustrated. In pass gate circuit 200, the INTERNAL REFRESH control signal is connected through an inverter 202 to a first input of NAND gate 204 and also to the first input of a NAND gate 206. A second input of NAND gate 204 is connected to the PROGRAM CYCLE control signal, and a second input of NAND gate 206 is connected to the ERASE CYCLE control signal. The PROGRAM CYCLE control signal is also connected through inverter 208 to the gate of N-channel MOS transistor 210, and the ERASE CYCLE control signal is also connected to a first input of NOR gate 212 and a first input of NAND gate 214 through an inverter 216. The ERASE/PROGRAM RESET control signal is connected to a first input of a NOR gate 218, and the RESET control signal is connected to a second input of a NOR gate 218. The output of NAND gate 204 is connected through an inverter 220 to a third input of NOR gate 218 and also to a second input of NOR gate 212 and a second input of NAND gate 214.

The output of NOR gate 218 is connected to the drain of N-channel MOS pass transistor 222, and the gates of N-channel MOS transistors 224 and 226. The gate of N-channel MOS pass transistor 222 is connected to the voltage source Vdd. The source of N-channel MOS pass transistor 222 is connected to the source of P-channel MOS transistor 228, the gate of P-channel MOS transistor 230, and the gate of P-channel MOS transistor 232. The drains and bulk (backgate) of P-channel MOS transistors 228, 230, and 232 are connected to source of diode connected N-channel MOS transistor 234. The gate and drain of N-channel MOS transistor 234 are connected to the variable voltage supply VM. The gate of P-channel MOS transistor 228 and the source of P-channel MOS transistor 230 are connected to the drain of N-channel MOS transistor 224. The source of P-channel MOS transistor 232 is connected to the drain of N-channel MOS transistor 226. The sources of N-channel MOS transistors 224 and 226 are connected to ground. The common connection of the source of P-channel MOS transistor 232 and the drain of N-channel MOS transistor 226 are connected to the drain of a P-channel MOS transistor pass gate 236. The gate of P-channel MOS transistor 236 is connected to ground.

The output of NAND gate 206 is connected through an inverter 238 to a first input of NAND gates 240 and 242. A second input of NAND gate 240 is connected to an INTERNAL CLOCK OSCILLATOR, and the output of NAND gate 240 is connected to a second input of NAND gate 242 and through capacitor 244 to the gate and drain of P-channel MOS transistor 246, and the source of P-channel MOS transistor 248. The output of NAND gate 242 is connected through capacitor 250 to the source of P-channel MOS transistor 246, the gate of P-channel MOS transistor 248, the source of a P-channel MOS transistor 252, and the gate and drain of a P-channel MOS transistor 254. A NEGATIVE VOLTAGE MULTIPLIER (NVM) bias is connected to the drains of P-channel MOS transistors 248 and 252.

A drain of N-channel MOS transistor 210 is connected to the source of P-channel MOS transistor 256. The source of N-channel MOS transistor 210 and the gate of P-channel MOS transistor 256 are both connected to ground. The backgates of P-channel MOS transistors 256, 254, 252, 248, 246, and 236 are all connected to the common connection of the source of P-channel MOS transistor 232, the drain of N-channel MOS transistor 226 and the drain of P-channel MOS transistor pass gate 236. Also connected to this common connection are the gates and backgates of P-channel MOS transistors 258, 260, 262 and 264, and the backgates of P-channel MOS transistors 266, 268, 270, 272, 274, 276, 278 and 280.

The drains of P-channel MOS transistors 258, 260, 262 and 264 are coupled to ground, and the sources of P-channel MOS transistors 258, 260, 262 and 264 are connected to the drains and gates of P-channel MOS transistors 266, 268, 270 and 272, respectively, and to a first plate of capacitors 282, 284, 286 and 288, respectively. The sources of P-channel MOS transistors 260, 262 and 264 are also connected to the sources of P-channel MOS transistors 266, 268 and 270, respectively. The source of P-channel MOS transistors 272 is connected to the drains and gates of P-channel MOS transistors 274 and 280. The source of P-channel MOS transistors 274 is connected to the gate and drain of P-channel MOS transistor 276, the source of P-channel MOS transistors 276 is connected to the gate and drain of P-channel MOS transistor 278, and the source of P-channel MOS transistors 278 is connected to ground.

The INTERNAL REFRESH control signal is also connected through an inverter 290 to a first input of a NOR gate 292. A second input of NOR gate 292 to the ERASE/PROGRAM RESET control signal, and the output of NOR gate 292 is connected to a first input of NAND gate 294 and a first input of NAND gate 296. A second input of NAND gate 294 is connected to the INTERNAL CLOCK OSCILLATOR, and the output of NAND gate 294 is connected to a second input of NAND gate 296 and a second plate of capacitors 282 and 286. The output of NAND gate 296 is connected to a second plate of capacitors 284 and 288.

The source of P-channel MOS transistor 236, the gate of P-channel MOS transistor 252, the source of P-channel MOS transistor 254, the drain of P-channel MOS transistor 256 and the source of P-channel MOS transistor 280 are connected at a common node that forms the PASSGATE signal of pass gate circuit 200.

The output of NAND gate 214 is connected to the drain of N-channel MOS transistor 298 and the gate of N-channel MOS transistor 300. The source of N-channel MOS transistor 298 is connected to the source of P-channel MOS transistor 302, the gate of P-channel MOS transistor 304, and the gate of P-channel MOS transistor 306. A variable voltage source, VMP, is coupled to drain and bulk (backgate) of P-channel MOS transistors 302, 304 and 306. The gate of P-channel MOS transistor 302, the source of P-channel MOS transistor 304, and the drain of N-channel MOS transistor 300 form a common connection. The source of N-channel MOS transistor 300 is coupled to ground.

The output of NOR gate 212 is coupled to the gate of an N-channel MOS transistor 308. The source of N-channel MOS transistor 308 is coupled to ground, and the drain of N-channel MOS transistor 308 is connected to the source of P-channel MOS transistor 306. The gate of an N-channel MOS transistor 310 is coupled to the ERASE CYCLE control signal, and the drain of N-channel MOS transistor 310 is coupled to the variable bias voltage VWG. The common connection of the drain of N-channel MOS transistors 308, the source of N-channel MOS transistor 310, and the source of P-channel MOS transistors 306 form the PULL DOWN signal of pass gate circuit 200.

Figure 8:
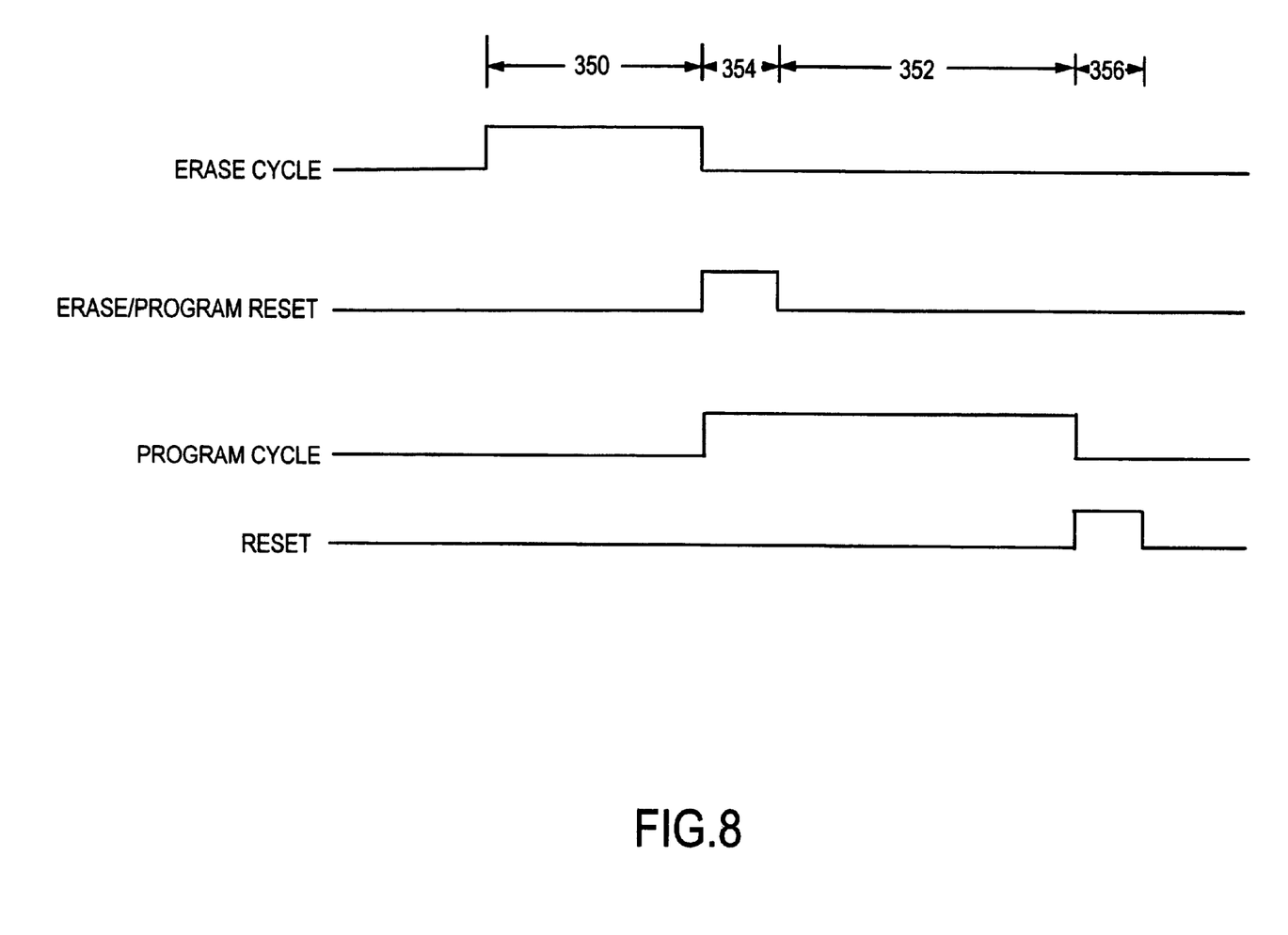
FIG. 8 is a timing diagram of signals employed according to a third embodiment of the present invention.

In FIG. 8, Table IV illustrates the voltages of the PASSGATE and PULLDOWN signals for various modes according to the present invention, and Table V illustrates the voltages of the voltage supplies VM, VMP, VWG, and NVM for various modes according to the present invention.

Figure 4:
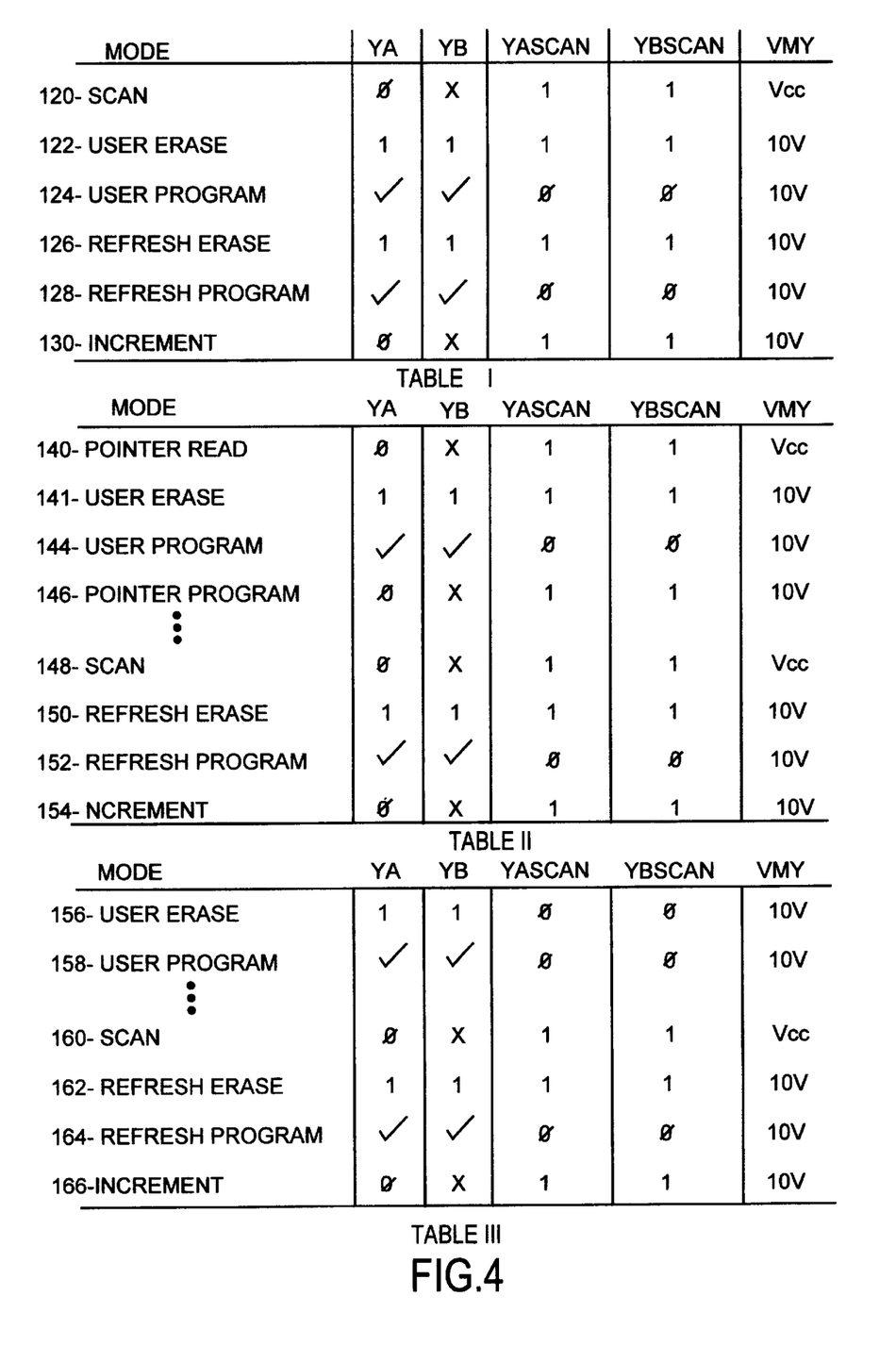
FIG. 4 illustrates Tables I, II, and III indicating the signals employed according to first, second and third embodiments of the present invention.
Figure 7:
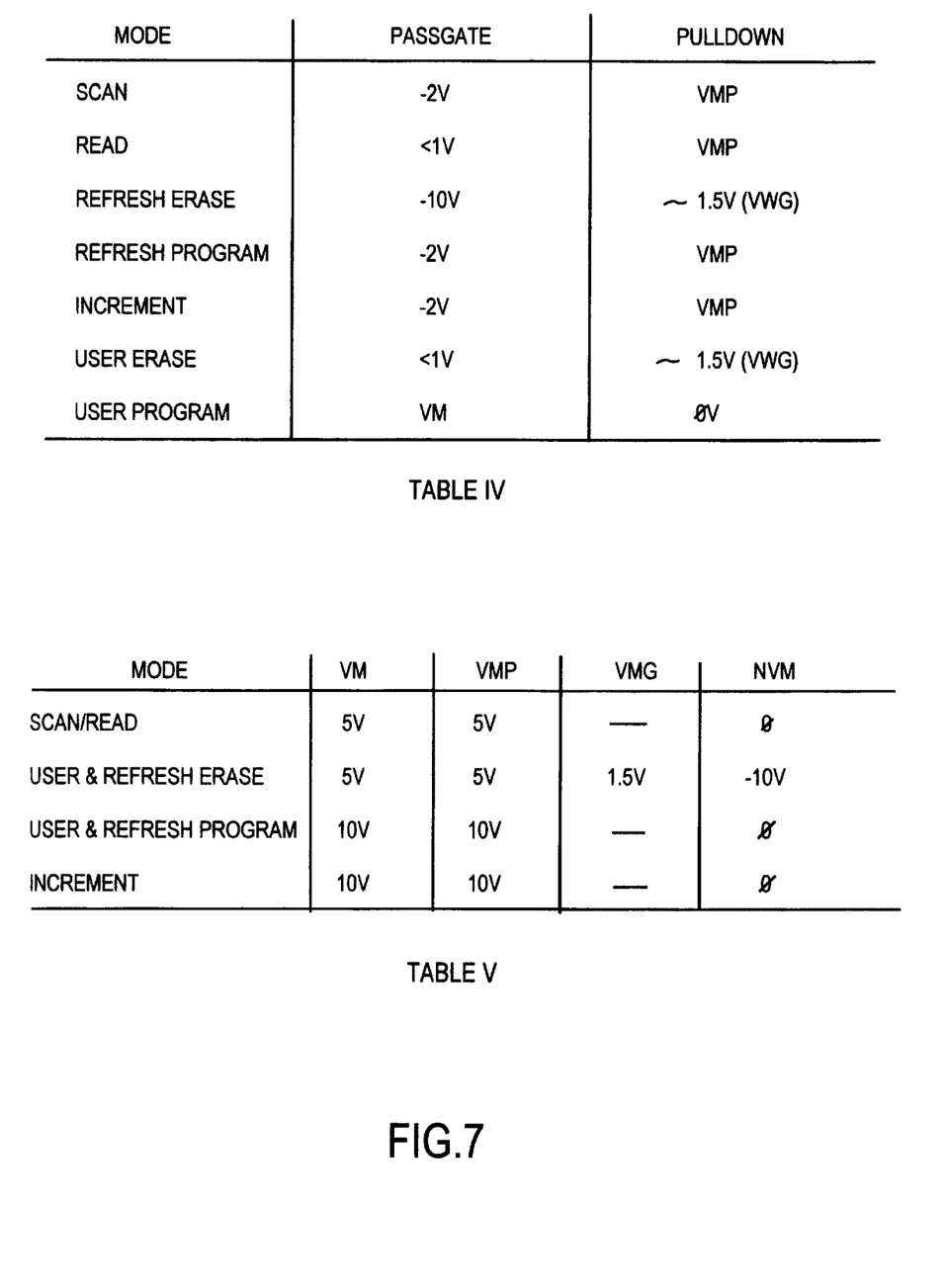
FIG. 7 is tables illustrating signals employed according to the third embodiment of the present invention.

With regard to the passgate circuit 200 in FIG. 7, for the operation of the third embodiment of the present invention, when the internal refresh operation is performed as shown in the SCAN, REFRESH ERASE, REFRESH PROGRAM and INCREMENT operations at steps 160, 162, 164 and 166 depicted in Table II of FIG. 4, the control signal INTERNAL REFRESH applied to pass gate circuit 200 will be a HIGH logic level, and when the user ERASE and PROGRAM cycle operations are performed as shown in the USER ERASE and USER PROGRAM operations at steps 156 and 158 in Table III of FIG. 4, the control signal INTERNAL REFRESH applied to the pass gate circuit 200 will be a LOW logic level.

During the SCAN operation, the control signals ERASE CYCLE and PROGRAM CYCLE will both be at a LOW logic level. As a result, the PASSGATE signal applied to the gates of P-channel MOS pass transistors 172 of FIG. 5 is −2 volts, and the PULLDOWN signal applied to the gates of P-channel MOS pull-down transistors 174 of FIG. 5 is approximately 5 volts (VMP).

During the REFRESH ERASE operation, the control signal ERASE CYCLE will be HIGH and the control signal PROGRAM CYCLE will be at a LOW as shown at reference numeral 350 in FIG. 8. As a result, the PASSGATE signal applied to the gates of P-channel MOS pass transistors 172 of FIG. 5 is approximately −10 volts, and the PULLDOWN signal applied to the gates of P-channel MOS pull-down transistors 174 of FIG. 5 is approximately 1.5 volts (VWG).

During the REFRESH PROGRAM operation, the control signal ERASE CYCLE will be LOW and the control signal PROGRAM CYCLE will be HIGH as shown at reference numeral 352 in FIG. 8. The ERASE/PROGRAM RESET control signal will also briefly pulse HIGH as shown at reference numeral 354. As a result, the PASSGATE signal applied to the gates of P-channel MOS pass transistors 172 of FIG. 5 is −2 volts, and the PULLDOOWN signal applied to the gates of P-channel MOS pull-down transistors 174 of FIG. 5 is approximately 10 volts (VMP).

During the INCREMENT operation, the control signal ERASE CYCLE will be LOW and the control signal PROGRAM CYCLE will be HIGH. As a result, the PASSGATE signal applied to the gates of P-channel MOS pass transistors 172 of FIG. 5 is −2 volts, and the PULLDOWN signal applied to the gates of P-channel MOS pull-down transistors 174 of FIG. 5 is approximately 10 volts (VMP). At the end of the INCREMENT operation, the RESET control signal will briefly pulse HIGH as shown at reference numeral 356 to reset the pass gate circuit 200.

During the USER ERASE operation with the INTERNAL REFRESH control signal LOW, the control signal ERASE CYCLE will be HIGH and the control signal PROGRAM CYCLE will be at a LOW as shown at reference numeral 350 in FIG. 8. As a result, the PASS GATE signal applied to the gates of P-channel MOS pass transistors 172 of FIG. 5 is less than 1 volt, and the PULLDOWN signal applied to the gates of P-channel MOS pull-down transistors 174 of FIG. 5 is approximately 1.5 volts (VWG).

During the USER PROGRAM operation with the INTERNAL REFRESH control signal LOW, the control signal ERASE CYCLE will be LOW and the control signal PROGRAM CYCLE will be HIGH as shown at reference numeral 352 in FIG. 8. The ERASE/PROGRAM RESET control signal will also briefly pulse HIGH as shown at reference numeral 354 As a result, the PASSGATE signal applied to the gates of P-channel MOS pass transistors 172 of FIG. 5 is approximately 10 volts, and the PULLDOWN signal applied to the gates of P-channel MOS pull-down transistors 174 of FIG. 5 is approximately 0 volts.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method of operating a flash memory array having a plurality of word lines in a first direction and a plurality of bit lines and a refresh pointer bit line in a second direction to form an array of intersections between said word lines and said bit lines, a plurality of flash memory cells disposed at said intersections, and a plurality of refresh select circuits, a separate one of said refresh select circuits disposed serially in each of said word lines between a last bit line in said array and said refresh pointer bit line, each of said plurality of refresh select circuits having a P-channel MOS pass transistor and a P-channel MOS pull-down transistor comprising:

scanning said flash memory array for a row to be refreshed and simultaneously turning on said P-channel MOS pass transistor and turning off said P-channel MOS pull-down transistor;

erasing said row to be refreshed in said flash memory array and simultaneously turning on said P-channel MOS pass transistor and turning off said P-channel MOS pull-down transistor;

programming said row to be refreshed in said flash memory array and simultaneously turning on said P-channel MOS pass transistor and turning off said P-channel MOS pull-down transistor; and incrementing an address of said row to be refreshed in said flash memory array and simultaneously turning on said P-channel MOS pass transistor and turning off said P-channel MOS pull-down transistor.

2. A method of operating a flash memory away as in claim 1, wherein prior to said scanning said method further includes:

erasing a selected row in said flash memory array and simultaneously turning off said P-channel MOS pass transistor and turning on said P-channel MOS pull-down transistor; and programming said selected row in said flash memory array and simultaneously turning off said P-channel MOS pass transistor and turning on said P-channel MOS pull-down transistor.

3. An address pointer for a flash memory array having a plurality of word lines in a first direction and a plurality of bit lines in a second direction to form an array of intersections between said word lines and said bit lines, and a plurality of flash memory cells disposed at said intersections comprising:

a refresh pointer bit line forming intersections with said word lines in said array;

a plurality of flash memory cells disposed at said intersections between said refresh pointer bit line and word line; and a plurality of refresh select circuits, a separate one of said refresh select circuits disposed serially in each of said word lines between a last bit line in said array and said refresh pointer bit line.

4. An address pointer for a flash memory array as in claim 3, wherein each of said plurality of refresh select circuits includes:

a P-channel MOS pass transistor having a drain coupled to said word line from said last bit line, a source coupled to said word line to said refresh pointer bit line, and a gate coupled to a pass gate control line; and a P-channel MOS pull-down transistor having a drain coupled to said source of said P-channel MOS pass transistor, a source coupled to ground, and a gate coupled to a pull-down control line.

\* \* \* \* \*